(12) United States Patent
Rangarajan et al.

(10) Patent No.: US 11,749,552 B2
(45) Date of Patent: Sep. 5, 2023

(54) WAFER PROCESSING TOOLS AND METHODS THEREOF

(71) Applicant: Applied Materials, Inc., Santa Clara, CA (US)

(72) Inventors: Jagan Rangarajan, Fremont, CA (US); Edward Golubovsky, San Jose, CA (US); Shaun Van Der Veen, San Jose, CA (US); Justin Ho Kuen Wong, Pleasanton, CA (US); Steven M. Zuniga, Soquel, CA (US)

(73) Assignee: Applied Materials, Inc., Santa Clara, CA (US)

( * ) Notice: Subject to any disclaimer, the term of this patent is extended or adjusted under 35 U.S.C. 154(b) by 737 days.

(21) Appl. No.: 16/738,798

(22) Filed: Jan. 9, 2020

(65) Prior Publication Data
US 2020/0234995 A1    Jul. 23, 2020

Related U.S. Application Data

(60) Provisional application No. 62/794,556, filed on Jan. 18, 2019.

(51) Int. Cl.
*H01L 21/677* (2006.01)
*H01L 21/687* (2006.01)
*B24B 41/06* (2012.01)
*H01L 21/67* (2006.01)

(52) U.S. Cl.
CPC ........ *H01L 21/68707* (2013.01); *B24B 41/06* (2013.01); *H01L 21/67028* (2013.01); *H01L 21/67051* (2013.01); *H01L 21/67703* (2013.01)

(58) Field of Classification Search
CPC ............. H01L 21/677; H01L 21/67706; H01L 21/67739; H01L 21/67742
See application file for complete search history.

(56) References Cited

U.S. PATENT DOCUMENTS

| 5,738,574 | A  | 4/1998  | Tolles et al.  |
| 6,645,550 | B1 | 11/2003 | Cheung et al. |
| 6,818,066 | B2 | 11/2004 | Cheung        |
| 7,044,832 | B2 | 5/2006  | Yilmaz et al. |

(Continued)

FOREIGN PATENT DOCUMENTS

| JP | 2000-061833   | 2/2020 |
| WO | WO 2007/028074 | 3/2007 |

OTHER PUBLICATIONS

International Search Report and Written Opinion in International Appln. No. PCT/US2020/012957, dated Apr. 29, 2020, 11 pages.

*Primary Examiner* — Jae Lee
(74) *Attorney, Agent, or Firm* — Fish & Richardson P.C.

(57) ABSTRACT

A wafer processing device may include a wafer exchanger including two or more blades, each of the two or more blades may be configured to receive a wafer, the two or more blades may be rotatable about an axis on a single horizontal plane, and the two or more blades may be movable between at least a load cup and a robot access location; wherein the load cup may include a wafer station that is vertically moveable relative a blade located in the load cup and may be configured to remove a wafer from a blade located in the load cup and place a wafer on a blade located in the load cup. Other devices, load cups and methods are also disclosed herein.

14 Claims, 7 Drawing Sheets

(56) References Cited

U.S. PATENT DOCUMENTS

| | | | |
|---|---|---|---|
| 7,811,153 B1 * | 10/2010 | Blank | H01L 21/67742 |
| | | | 451/9 |
| 8,308,529 B2 | 11/2012 | D'Ambra et al. | |
| 10,777,445 B2 * | 9/2020 | Nishiwaki | H01L 21/68764 |
| 2003/0003848 A1 | 1/2003 | Tobin | |
| 2006/0255016 A1 | 11/2006 | Svirchevski et al. | |
| 2009/0263215 A1 | 10/2009 | Hudgens et al. | |
| 2013/0115862 A1 | 5/2013 | Rangarajan et al. | |
| 2017/0323822 A1 | 11/2017 | Velaquez | |

* cited by examiner

US 11,749,552 B2

WAFER PROCESSING TOOLS AND METHODS THEREOF

CROSS-REFERENCE TO RELATED APPLICATIONS

This claims priority to U.S. application Ser. No. 62/794,556, filed on Jan. 18, 2019, the disclosure of which is incorporated by reference.

FIELD

The present application relates to wafer processing, and more specifically to wafer processing tools and methods thereof.

BACKGROUND

Wafer processing tools, such as chemical mechanical polishing (CMP) systems, may encounter delays caused by the transfer of wafers between different processing stations. For example, processing may be delayed as robots wait to access wafers before and/or after different processes.

SUMMARY

In a first aspect, a wafer processing device is provided. The wafer processing device may include a wafer exchanger including two or more blades, each of the two or more blades configured to receive a wafer, the two or more blades rotatable about an axis on a single horizontal plane, and the two or more blades movable between at least a load cup and a robot access location; wherein the load cup includes a wafer station that is vertically moveable relative a blade located in the load cup and is configured to remove a wafer from a blade located in the load cup and place a wafer on a blade located in the load cup.

In a second aspect, a load cup is provided. The load cup may include a wafer station configured to receive a wafer, the wafer station moveable in a vertical direction between a first location where the wafer station is spaced from a wafer and a second location where a wafer is received by the wafer station; and a notch in the wafer station, the notch sized to receive a portion of a blade configured to support a wafer as the wafer station moves between the first location and the second location.

In a third aspect, a method of moving substrates is provided. The method may include providing a wafer exchanger including two or more blades, each of the two or more blades configured to receive a wafer, the two or more blades rotatable about an axis on a single horizontal plane, and the two or more blades movable between at least a load cup and a robot access location; placing a first wafer onto a blade of the wafer exchanger located at the robot access location; placing a second wafer from a head onto a blade of the wafer exchanger located at the load cup; rotating the wafer exchanger to a position where the second wafer is located at the robot access location; removing the second wafer from the wafer exchanger; rotating the wafer exchanger to a position where the first wafer is located in the load cup; placing the first wafer into the head; and placing a third wafer from the robot access location onto a blade of the wafer exchanger.

Numerous other aspects are provided in accordance with these and other embodiments of the disclosure. Other features and aspects of embodiments of the disclosure will become more fully apparent from the following detailed description, the appended claims, and the accompanying drawings.

BRIEF DESCRIPTION OF DRAWINGS

The drawings, described below, are for illustrative purposes only and are not necessarily drawn to scale. The drawings are not intended to limit the scope of the disclosure in any way. Wherever possible, the same or like reference numbers will be used throughout the drawings to refer to the same or like parts.

DETAILED DESCRIPTION

Wafer processing devices, such as chemical mechanical polishing (CMP) systems, may encounter delays caused by the transfer of wafers between different processing stations. For example, processing may have to wait for robots to gain access to wafers before and/or after different processes, which may be time consuming. The wafer processing devices disclosed herein and illustrated in FIGS. 1-7 reduce wafer processing times relative to traditional wafer processing devices.

Figure 1:
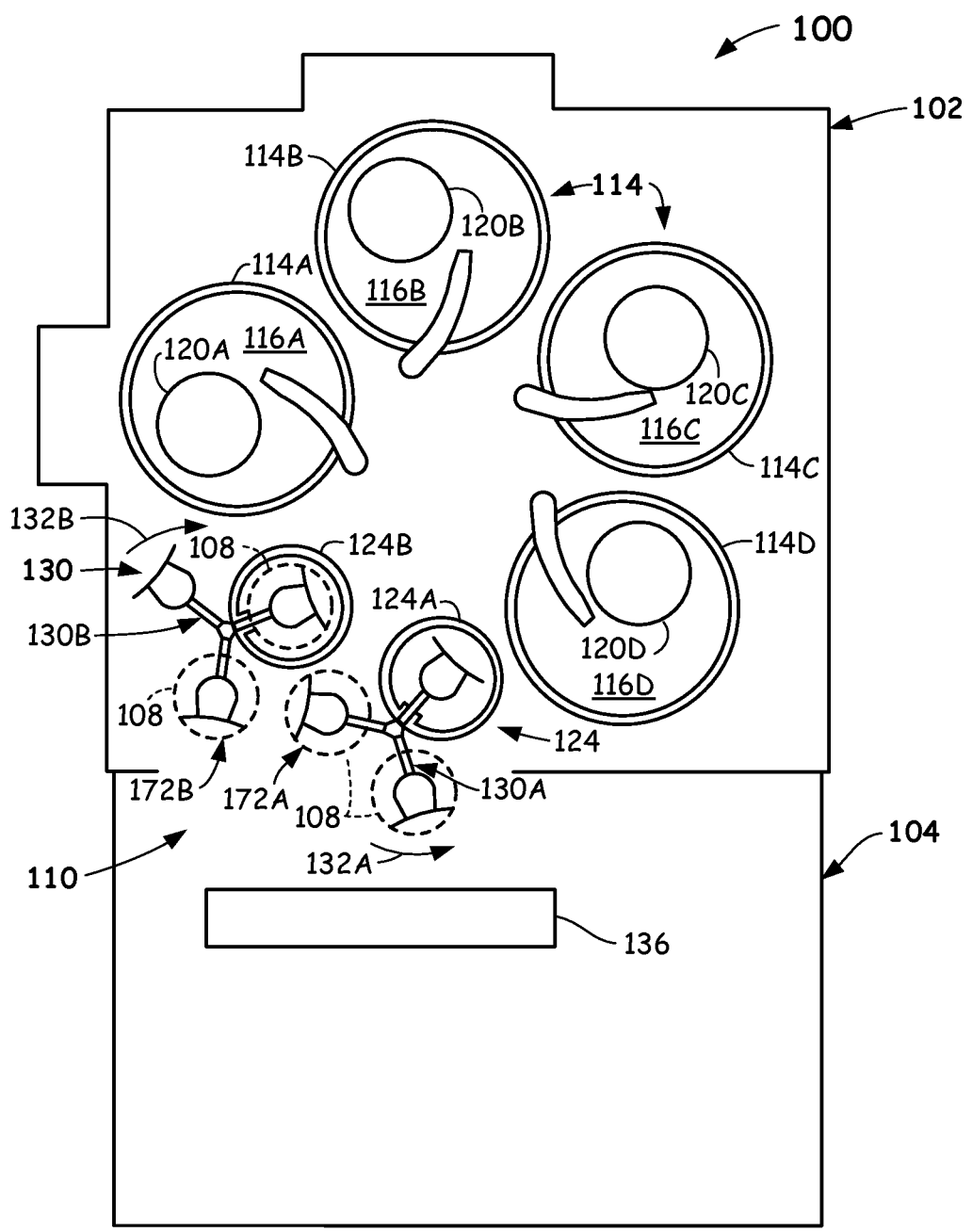
FIG. 1 illustrates a top, plan view of a chemical mechanical polishing (CMP) system according to embodiments disclosed herein.

Reference is made to FIG. 1, which illustrates a top plan view of a chemical mechanical polishing (CMP) system 100. Although a CMP system is illustrated in FIG. 1 and described herein, the concepts disclosed herein may be applied to other wafer processing devices. The CMP system 100 may include a polishing section 102 and a cleaning and drying section 104 that process (e.g., wash and/or polish) wafers 108 (a few labelled). The CMP system 100 may include other sections that perform other processes on wafers. Wafers, as used herein, may include articles used to make electronic devices or circuit components. Wafers may also include semiconductor wafers, silicon-containing wafers, patterned or unpatterned wafers, glass plates, masks, and the like. A pass-through 110 may be located between the polishing section 102 and the cleaning and drying section 104. The pass-through 110 may be an opening between the polishing section 102 and the cleaning and drying section 104 that accommodates the transfer of wafers 108.

The polishing section 102 may include one or more polishing stations 114. In the embodiment illustrated in FIG. 1, the polishing section 102 includes four polishing stations 114, referred to individually as polishing stations 114A-114D. The polishing section 102 may include fewer than or more than four polishing stations 114. Each of the polishing stations 114 may include a polishing pad. The polishing pads are referred to individually as polishing pads 116A-116D. The polishing pads 116A-116D may rotate against surfaces of the wafers 108 to perform various polishing processes. One or more slurries (not shown) may be applied between a substrate and a polishing pad to process the substrate. For example, a slurry may remove a specific thickness or layer of a substrate. In some embodiments, the slurries may include corrosion inhibitors and other chemicals that may process the wafers 108.

The polishing section 102 may include a plurality of heads that maintain the wafers 108 against the polishing pads 116A-116D during polishing. For example, each of the polishing stations 114 may include a head. In the embodiment of FIG. 1, the polishing stations 114 include four heads, referred to individually as heads 120A-120D, wherein each of the individual polishing stations 114 may include or be associated with a single head.

The heads 120A-120D may secure the wafers 108 therein as the heads 120A-120D are transported to and from the polishing stations 114. For example, the heads 120A-120D may secure the wafers 108 therein as the heads are transported between load cups 124 and the polishing stations 114. The polishing section 102 depicted in FIG. 1 includes two load cups 124, referred to individually as a first load cup 124A and a second load cup 124B. The load cups 124 may transport wafers 108 between the heads 120A-120D and wafer exchangers 130. In some embodiments, the polishing section 102 may include a single load cup or more than two load cups.

The CMP system 100 illustrated in FIG. 1 includes two wafer exchangers 130, referred to individually as a first wafer exchanger 130A and a second wafer exchanger 130B. In some embodiments, the CMP system 100 may include one or more than two wafer exchangers 130. The first wafer exchanger 130A may rotate in a first direction 132A and the second wafer exchanger 130B may rotate in a second direction 132B, which may be opposite the first direction 132A. In some embodiments, the first wafer exchanger 130A and the second wafer exchanger 130B may rotate in the same direction.

The cleaning and drying section 104 may include a robot 136, such as a wet robot, that may transfer wafers 108 through the pass-through 110. For example, the robot 136 may load and remove wafers 108 from the first wafer exchanger 130A and/or the second wafer exchanger 130B at a first robot access location 172A and a second robot access location 172B. The robot 136 may also transfer wafers 108 between various stations (not shown) in the cleaning and drying section 104 and the wafer exchangers 130. The robot 136 may access the wafers 108 from the wafer exchangers 130 at other robot access locations.

Figure 2:
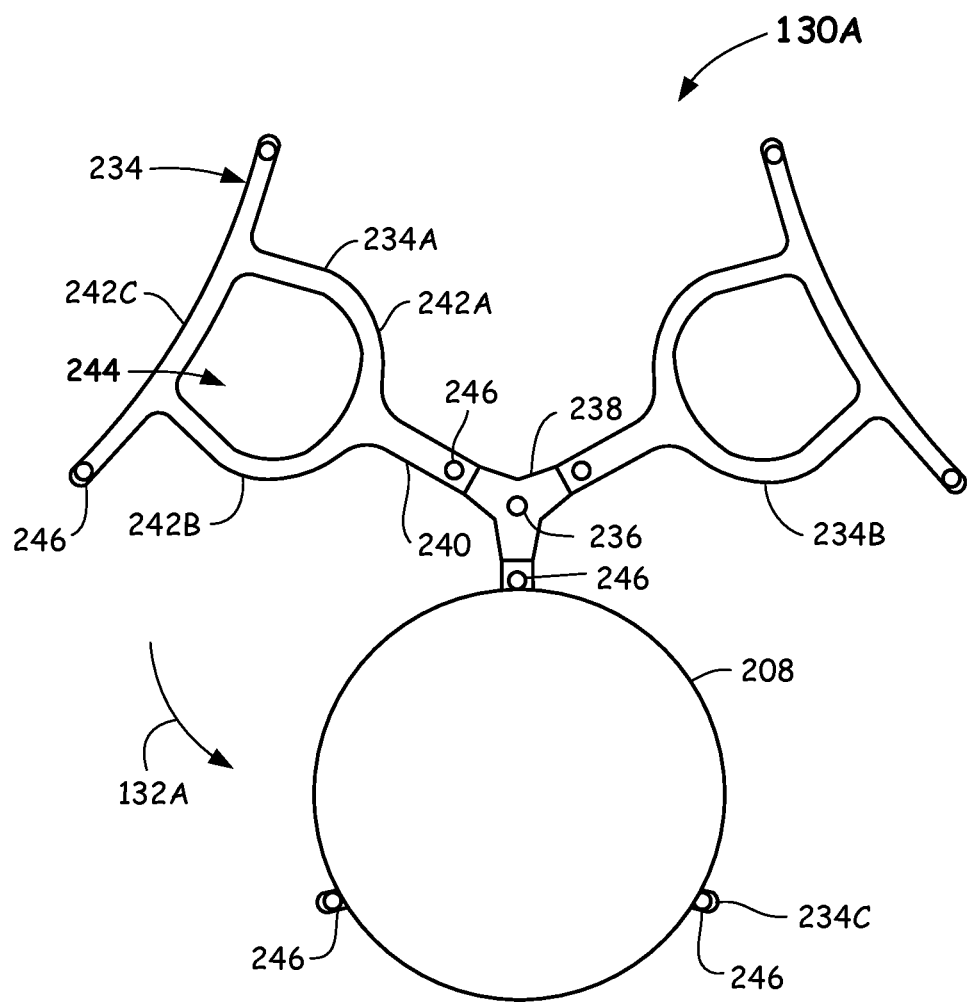
FIG. 2 illustrates an enlarged, top, plan view of a wafer exchanger used in a CMP system according to embodiments disclosed herein.

Reference is now made to FIG. 2, which illustrates an enlarged, top, plan view of the first wafer exchanger 130A. The first wafer exchanger 130A may be substantially similar or identical to the second wafer exchanger 130B. The first wafer exchanger 130A may include a plurality of blades 234. For example, the first wafer exchanger 130A may include three or more blades 234. Fewer blades, such as two or more blades, may also be employed. In the embodiment of FIGS. 1 and 2, the first wafer exchanger 130A includes three blades 234, which are referred to individually, as a first blade 234A, a second blade 234B, and a third blade 234C. In the view of FIG. 2, the third blade 234C is partially obscured by a wafer 208 received thereon. The blades 234 may be oriented to provide even spacing between the blades 234. For example, the three blades 234 of FIG. 2 may be oriented 120° apart relative to a rotation point 236. The first wafer exchanger 130A may rotate about an axis (e.g., a vertically-extending axis) centered at the rotation point 236. Other embodiments of the first wafer exchanger 130A may include different numbers of blades 234 that may be spaced at different angles.

The blades 234 may be coupled to a support member 238 that may include the rotation point 236. The blades 234 may be, but need not be, substantially similar or identical to each other. The following description references the first blade 234A, which may be representative of all the blades 234 in the wafer exchangers 130 (FIG. 1). The first blade 234A may include an arm 240 that may be attached to the support member 238. As described in greater detail below, the arm 240 may be sized to be received in a portion (e.g., a notch 352A—FIG. 3) of the first load cup 124A. The arm 240 may be connected to a first frame member 242A and a second frame member 242B, which both may be connected to a third frame member 242C. In some embodiments, the frame members 242A-242C and the arm 240 may be integrally formed. The frame members 242A-242C may define boundaries of an opening 244 in the first blade 234A. As described in greater detail below, the opening 244 may be sized and/or configured to enable spray emitted from a nebulizer (e.g., nebulizer 356—FIG. 3) to pass through the opening 244. The blades 234 may have other configurations.

The blades 234 may include supports 246 (a few labelled) that support substrates located on the blades 234. Reference is made to the third blade 234C where the wafer 208 is illustrated supported by the supports 246. The supports 246 may prevent the surface of the wafer 208 from contacting the frame members 242A-242C of the third blade 234C, which may cause damage to the wafer 208.

Figure 3:
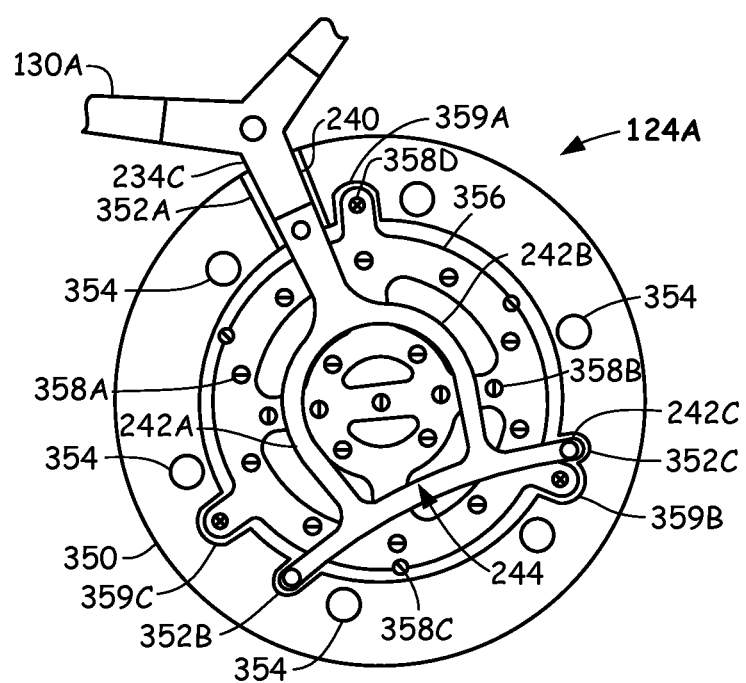
FIG. 3 illustrates a top, plan view of a load cup and a blade of a wafer exchanger located within the load cup according to embodiments disclosed herein.

Reference is now made to FIG. 3, which illustrates a top, plan, view of the first load cup 124A and the third blade 234C located therein. The first load cup 124A may be, but need not be, substantially similar or identical to the second load cup 124B (FIG. 1). The first load cup 124A may include a wafer station 350 that has an annular shape. In some embodiments, the wafer station 350 may have other shapes. The wafer station 350 may move vertically to place wafers onto the third blade 234C and to remove wafers from the third blade 234C. For example, the third blade 234C may remain fixed in the vertical direction as the wafer station 350 moves vertically relative to the third blade 234C.

The wafer station 350 may include a notch 352A, wherein the arm 240 of the third blade 234C is received in the notch 352A as the wafer station 350 moves in the vertical direction. The wafer station 350 may also include a notch 352B and a notch 352C that may receive the third frame member 242C of the third blade 234C as the wafer station 350 moves in the vertical direction. A wafer may rest on raised features on the wafer station. As the wafer station 350 moves in an upward direction and removes a wafer from the third blade 234C, the wafer is positioned within a plurality of pins 354 (e.g., which may create a pocket to center the wafer).

The first load cup 124A may also include a nebulizer 356, wherein the nebulizer 356 may spray fluids (e.g., deionized water) onto the third blade 234C, a substrate (not shown in FIG. 3A) located on the third blade 234C, and/or a head located above the first load cup 124A. The nebulizer 356 may include first nozzles 358A (noted by horizontal lines) that may rinse a wafer received on the third blade 234C. The nebulizer 356 may include between ten and eighteen first nozzles 358A. In some embodiments, the nebulizer 356 may include between thirteen and fifteen first nozzles 358A that may provide between 1.5 liters per minute (lpm) and 2.1 lpm of a rinse solution. In some embodiments, the nebulizer 356 may include second nozzles 358B (noted by vertical lines) that may rinse a membrane. The nebulizer 356 may include between five and nine second nozzles 358B that may provide between 4.0 lpm and 6.0 lpm of a rinse solution. The nebulizer 356 may include third nozzles 358C (noted by diagonal lines) that may rinse portions of a head, such as a gap between the head (e.g., head 120D—FIG. 4A) and a wafer (e.g., wafer 208—FIG. 4A). The nebulizer may include between two and four third nozzles 358C that may provide about between 2.0 lpm and 4.0 lpm of rinse solution. In some embodiments, the nebulizer 356 may include fourth nozzles 358D (noted by crossed lines) that may rinse a retaining ring (not shown) in a head. The nebulizer may include between two and four fourth nozzles 358D that provide between 1.0 lpm and 4.0 lpm of rinse solution. The nebulizer 356 may include other numbers and configurations of nozzles and/or other flow rates of rinse solution.

The nozzles 358A-358D may be independently controlled. For example, the first nozzles 358A may be controlled independent of the second nozzles 358B. As shown in FIG. 3, the configuration of the third blade 234C and the configuration of the nozzles 358A-358D is such that the third blade 234C does not block any of the nozzles 358A-358D. For example, the configuration of the frame members 242A-242C and the opening 244 does not block any of the nozzles 358A-358D. This configuration of the frame members 242A-242C and the nozzles 358A-358C may enable one or more of the heads 120A-120D (FIG. 1) to be rinsed without obstruction by a blade (e.g., the third blade 234C). In some embodiments, the nebulizer 356 remains stationary within the first load cup 124A. Therefore, the nebulizer 356 may be coupled to supplies of rinse solution (not shown) by way of fixed pipes rather than flexible tubing. The fixed pipes may have reduced maintenance compared to flexible tubing.

The wafer station 350 may include other features that accommodate the first blade 234A and/or the nebulizer 356. For example, the nebulizer 356 may have tabs that support the fourth nozzles 358D. The wafer station 350 may have corresponding notches 359A-359C that accommodate the tabs. Thus, the wafer station 350 may move relative to the nebulizer 356 without being impeded by the tabs.

Figure 4A:
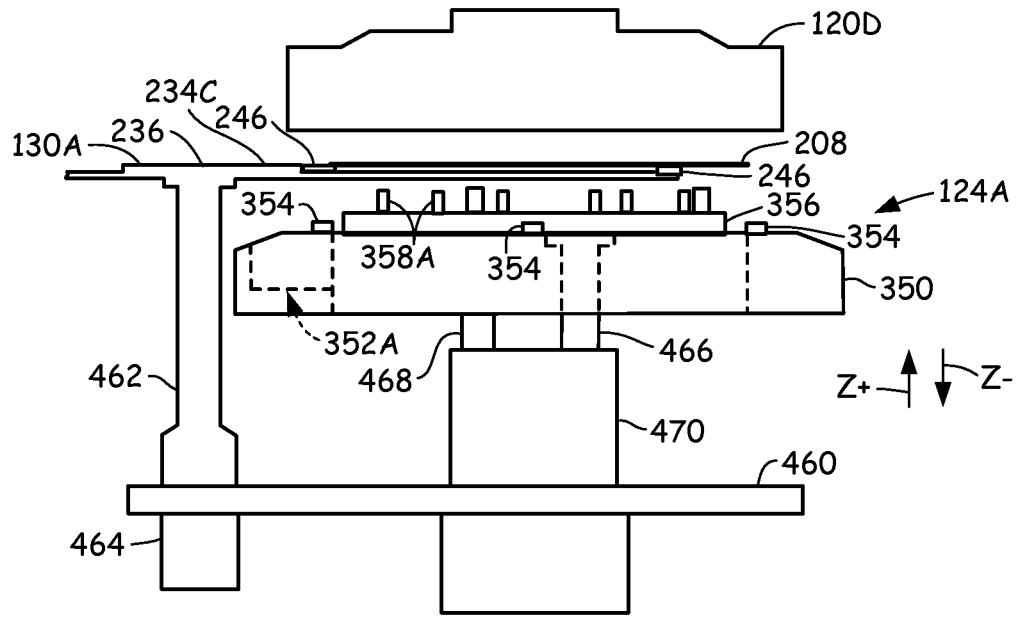
FIG. 4A illustrates a load cup in a retracted position according to embodiments disclosed herein.

Reference is now made to FIG. 4A, which illustrates an example of the head 120D located proximate the first load cup 124A. The first load cup 124A may include or be attached to a support plate 460. The first wafer exchanger 130A may be coupled to the support plate 460 by way of a shaft 462. A motor 464, such as a servo motor, may rotate the shaft 462 in the first direction 132A (FIG. 1) or the second direction 132B (FIG. 1). Rotation of the shaft 462 rotates the first wafer exchanger 130A about an axis extending through the shaft 462 and/or the rotation point 236.

The nebulizer 356 may be coupled to the support plate 460 by way of one or more support members 466. In some embodiments, the support member 466 may maintain the nebulizer 356 in a fixed position relative to the support plate 460. Fluid lines (not shown) may be coupled to the nebulizer 356. For example, four fluid lines, one for each of the different types of nozzles 358A-358D, may be coupled to the nebulizer 356.

The wafer station 350 may be moveable in a vertical direction relative to the support plate 460. For example, the wafer station 350 may be moveable in a downward or Z-direction and upward in a Z+ direction relative to the support plate 460. The wafer station 350 may be in a first location when it is spaced from a wafer 208 supported on the third blade 234C. The wafer station 350 may be in a second location when it is located proximate a head 120D. A support member 468 may couple the wafer station 350 to an actuator 470 that provides vertical movement of the wafer station 350 relative to the support plate 460.

The first load cup 124A of FIG. 4A is shown in a retracted position where the wafer station 350 is moved in the Z-direction so that the third blade 234C of the first wafer exchanger 130A may move into and out of the first load cup 124A unimpeded. For example, the wafer 208 is supported on the supports 246 of the third blade 234C and the wafer station 350 is located below and spaced from the third blade 234C.

Figure 4B:
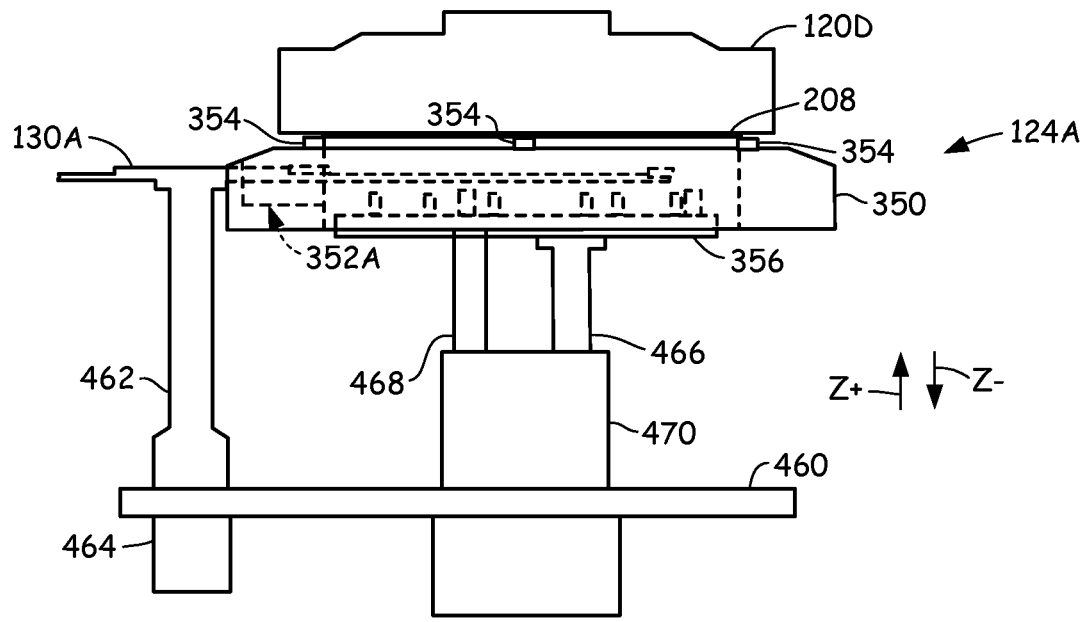
FIG. 4B illustrates a load cup in an extended position according to embodiments disclosed herein.

Reference is now made to FIG. 4B, which illustrates the first load cup 124A in an extended position. For example, the wafer support 350 has moved upward in the Z+ direction to the second location, so as to remove the wafer 208 from the third blade 234C or to move the wafer 208 proximate the head 120D. In the position of the wafer station 350 illustrated in FIG. 4B, the wafer 208 rests on raised features of the wafer station 350. Other actions may take place to transfer the wafer 208 to the head 120D.

In use, the actuator 470 may lower the wafer station 350 by moving the wafer station 350 in the Z– direction to the first location where a blade may enter the first load cup 124A unimpeded. The motor 464 may then rotate the shaft 462, which rotates the first wafer exchanger 130A. Rotation of the first wafer exchanger 130A may stop when a blade, such as the third blade 234C, with the wafer 208 located thereon is received in the first load cup 124A. The head 120D may move to a location above the first load cup 124A. The actuator 470 may then move the wafer station 350 upward in the Z+ direction to the second location where the wafer 208 is proximate the head 120D. The head 120D may grasp the wafer 208 and move the wafer 208 to one or more of the polishing stations 114 (FIG. 1) where a polishing process may be applied to the wafer 208.

When the wafer processing is complete, the head 120D may return with the wafer 208 to a location above the first load cup 124A. The actuator 470 may move the wafer station 350 in the Z+ direction to the first location where the wafer station 350 may receive the wafer 208 onto raised features of the wafer station 350. The actuator 470 may then lower the wafer station 350 in the Z– direction to where the wafer 208 is transferred to the supports 246 of the third blade 234C. The actuator 470 may continue to lower the wafer station 350 in the Z– direction to a location where the third blade 234C may move from the first load cup 124A unimpeded.

In some embodiments, sensors (not shown) may be located in the first load cup 124A and may sense the presence of the wafer 208. Sensors may also detect the presence of the wafer 208 in the head 120D. During loading of the wafer 208 into the head 124D, sensors may determine that no wafer is located on the wafer station 350. The wafer station 350 may then rise in the Z+ direction toward the wafer 208. When the wafer 208 transfers to the wafer station 350, sensors may detect the presence of the wafer 208 on the wafer station 350. The wafer station 350 may then continue rising in the Z+ direction to the head 120D where sensors in the head 120D detect the presence of the wafer 208. The wafer 208 may then be loaded into the head 120D. During unload from the head 120D, the sensors may detect that the wafer 208 has been unloaded from the head 120D and is present on the wafer station 350. The sensors on the wafer station 350 may also detect the absence of the wafer 208 as the wafer 208 transfers to the third blade 234C. The chemical mechanical polishing CMP system 100 may include other sensors.

During the above-described processes, the nebulizer 356 may rinse portions of the first blade 234A, the head 120D, the wafer station 350 and/or, the wafer 208. For example, the first nozzles 358A may rinse the wafer 208 after the wafer 208 has been polished. In some embodiments, the wafer 208 may be rinsed while the wafer 208 is in the head 120D and before the wafer 208 is transferred to the wafer station 350. In some embodiments, the wafer 208 may be rinsed when the wafer 208 is located in the first load cup 124A. In some embodiments, the first wafer exchanger 130A may rotate an empty blade into the first load cup 124A. The lack of a substrate in the first load cup 124A may enable the nebulizer 356 to rinse various portions of the head.

Reference is now made to FIGS. 5A-5D where the operation of the first wafer exchanger 130A and the second wafer exchanger 130B in conjunction with other components of the CMP system 100 are described. Wafers with cross-hatching have been polished or processed by the polishing stations 114 or other components and are to be transported to the robot 136. Wafers with diagonal hatching have been received from the robot 136 and are to be transported to the polishing stations 114. Empty circles represent blades in the first wafer exchanger 130A and the second wafer exchanger 130B that do not have wafers located thereon.

Figure 5A:
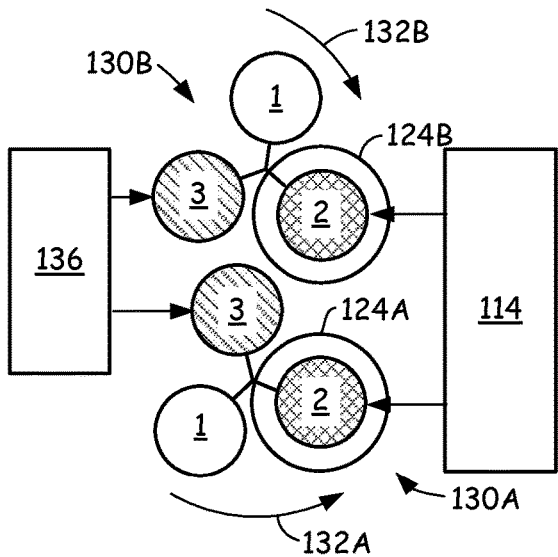
FIGS. 5A-5D illustrate the operation of wafer exchangers in conjunction with other components of a CMP system according to embodiments described herein.

The processing illustrated in FIGS. 5A-5D commences at FIG. 5A where first blades (indicated by the reference numeral 1) are empty. Second blades (indicated by the reference numeral 2) contain substrates that have been processed by the individual polishing stations 114 and are returned to the first load cup 124A and the second load cup 124B. Third blades (indicated by the reference numeral 3) contain substrates that have been received from the robot 136. During the stage depicted in FIG. 5A, heads (not shown in FIG. 5A) unload substrates into the first load cup 124A and the second load cup 124B and onto the second blades. In addition, new wafers are loaded from the robot 136 onto the third blades.

Figure 5B:
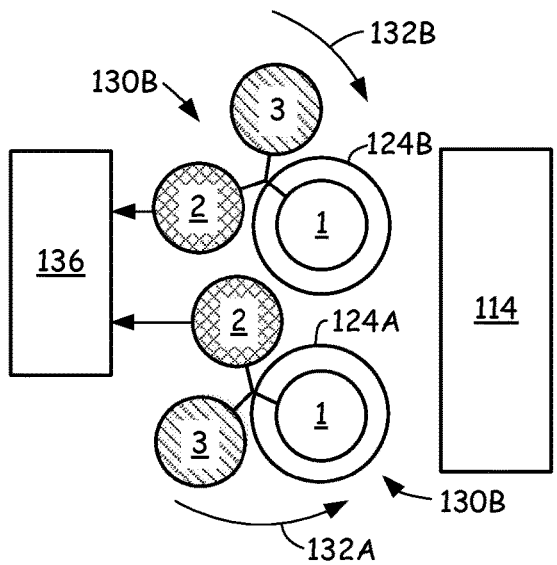

The first wafer exchanger 130A may rotate in the first direction 132A and the second wafer exchanger 130B may rotate in the second direction 132B to reach the configuration illustrated in FIG. 5B. The first blades, which may be empty, may be received in the first load cup 124A and the second load cup 124B. The nebulizer 356 (FIG. 3) may rinse the heads located above the first load cup 124A and the second load cup 124B without being impeded by a wafer located between the heads and the nebulizers. The empty blades may also be rinsed. In the configuration illustrated in FIG. 5B, the robot 136 may unload the processed wafers from the second blades.

Figure 5C:
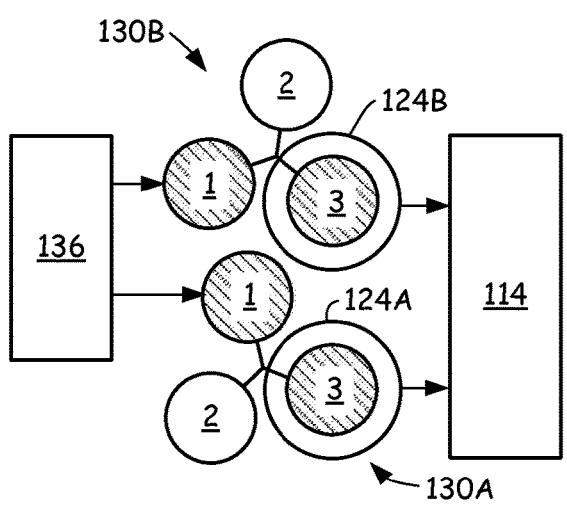
Figure 5D:
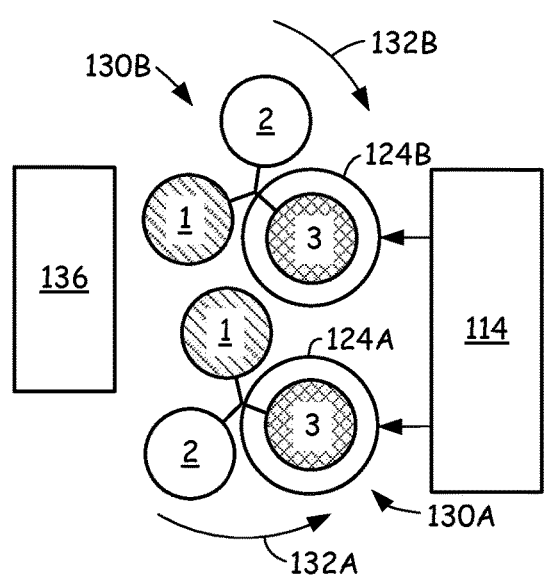

The first wafer exchanger 130A may rotate in the first direction 132A and the second wafer exchanger 130B may rotate in the second direction 132B to reach the configuration illustrated in FIG. 5C. The robot 136 may load wafers onto the first blades. In addition, the wafer exchangers 130 may unload wafers from the third blades to the heads and the heads may transport the wafers to the polishing stations 114. FIG. 5D illustrates the return of the wafers from the polishing stations 114 to the load cups 124. The first wafer exchanger 130A may rotate in the first direction 132A and the second wafer exchanger 130B may rotate in the second direction 132B to reach the configuration illustrated in FIG. 5A where the processes are repeated.

The process illustrated in FIGS. 5A-5D enables faster processing time relative to traditional CMP systems and methods. For example, the wafer exchangers 130 move wafers and blades to robot access locations (e.g., robot access locations 172A and 172B—FIG. 1) for the robot 136, so the robot 136 may have more time for unloading and loading wafers 108. The wafer exchangers 130 allow for faster cycle time by enabling parallel processing of wafers 108. For example, wafers 108 that have completed polishing may be unloaded and, in parallel, new wafers 108 may be loaded into the wafer exchangers 130. Therefore, the process relieves the robot 136 from being the bottleneck for wafer movements.

The movement of the wafer station 350 (FIG. 3) enables the wafer exchangers 130 to move solely on a single horizontal plane. Therefore, vertical movement, which may be time consuming, of the wafer exchangers 130 is not performed. As shown in FIGS. 5A-5D, the wafer exchangers 130 may operate with an empty blade, which enables the heads to be rinsed by the nebulizer 356 when the empty blades are located in the load cups 124. The blades of the wafer exchangers 130 may be rinsed at the same time. In the embodiment depicted in FIGS. 5A-5D, every third blade that enters the load cups 124 is empty, which enables rinsing of the head after two wafers have been processed.

Figure 6:
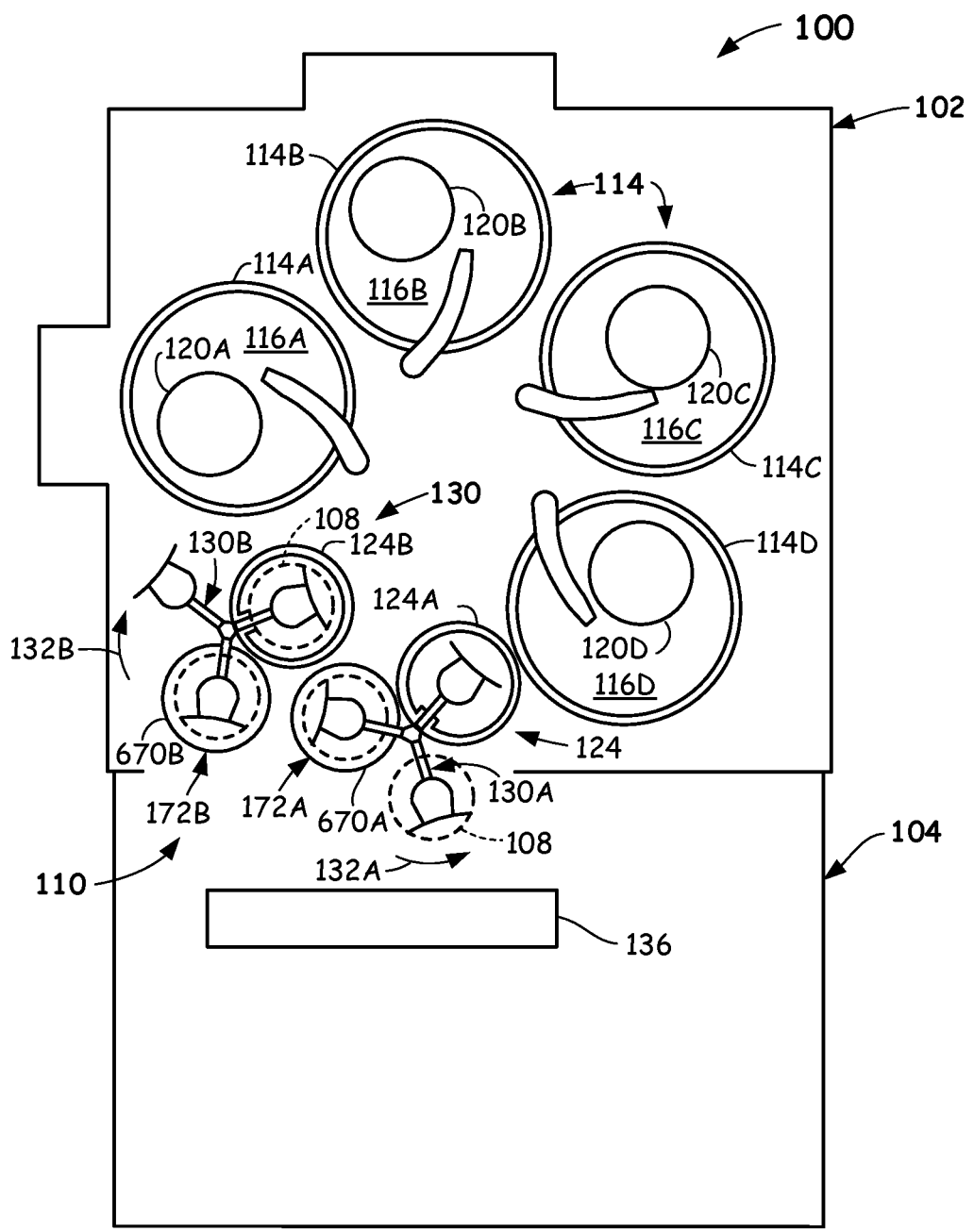
FIG. 6 illustrates a top, plan view of a CMP system that includes one or more rinse stations according to embodiments disclosed herein.

Referring to FIG. 6, which illustrates a top plan view of another embodiment of the CMP system, some embodiments of the CMP system 100 may include one or more rinse stations that are accessible by the wafer exchangers 130. The embodiment of the CMP system 100 of FIG. 6 includes a first rinse station 670A that is accessible by the first wafer exchanger 130A and a second rinse station 670B that is accessible by the second wafer exchanger 130B. In the embodiment of FIG. 6, the wafers 108 located on the wafer exchangers 130 may be in locations including the rinse stations 670A or 670B and the load cups 124. In the embodiment of FIG. 6, the rinse stations 670A, 670B may be in the same locations as the robot access locations 172A, 172B where the wafers 108 are accessible to the robot 136.

Figure 7:
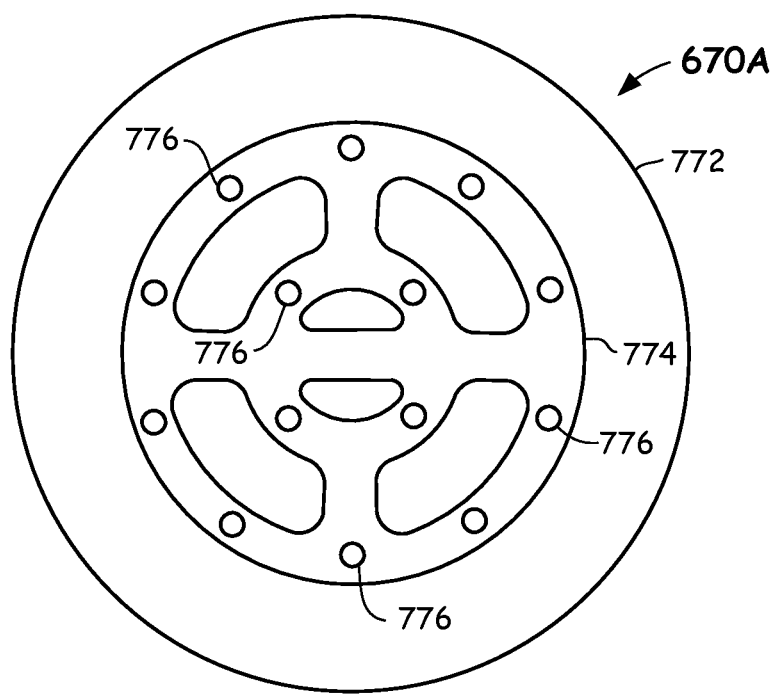
FIG. 7 illustrates a top plan view of a nebulizer that may be located in a rinse station in the CMP system of FIG. 6 according to embodiments disclosed herein.

Reference is now made to FIG. 7, which illustrates a top plan view of the first rinse station 670A, which may be identical or substantially similar to the second rinse station 670B (although they need not be). The first rinse station 670A may include a basin 772 that may collect cleaning fluids that would otherwise overspray into the polishing section 102 (FIG. 1). The first rinse station 670A may include a nebulizer 774 located within the basin 772. The nebulizer 774 may be similar to the nebulizer 356 (FIG. 3), but may only include nozzles 776 that are configured to rinse a substrate (not shown in FIG. 7) located at the first rinse station 670A. The nozzles 776 may be configured so as not to be impeded by a blade of the first wafer exchanger 130A located at the first rinse station 670A. In some embodiments, the layout and/or configuration of the nozzles 776 may be identical or substantially similar to the layout and/or configuration of the first nozzles 358A (FIG. 3) of the nebulizer 356. For example, the nebulizer 774 may include between ten and eighteen nozzles 776 that provide between 1.0 lpm and 4.0 lpm of rinse fluid. Referring to FIG. 6, the wafers 108 may be rinsed by the first rinse station 670A and the second rinse station 670B. The first rinse station 670A and the second rinse station 670B may include other features (not shown) that clean the wafers. The first rinse station 670A and the second rinse station 670B may serve to keep the wafers wet, especially after polishing.

In some embodiments, wafers 108 may rest on and/or between supports 246 such that wafers 108 may be moved without being gripped. In some embodiments, different spray patterns may be emitted by nozzles 358A, 358B, 358C and/or 358D. In some embodiments, one or more hard stops (not shown) may be used to limit vertical motion of the wafer station 350 (e.g., to limit how low or high the wafer station 350 may travel during wafer exchange operations). Any suitable mechanism may be used to move heads 120A-120D between polishing stations 114 and load cups 124.

The foregoing description discloses only example embodiments. Modifications of the above-disclosed apparatus and methods which fall within the scope of this disclosure will be readily apparent to those of ordinary skill in the art.

What is claimed is:

1. A wafer processing device, comprising:
a wafer exchanger including two or more blades, each of the two or more blades configured to receive a wafer, the two or more blades rotatable about an axis on a single horizontal plane, and the two or more blades movable between at least a load cup and a robot access location;
wherein the load cup includes a wafer station that is vertically moveable relative to a blade located in the load cup and is configured to remove a wafer from a blade located in the load cup and place the wafer on the blade located in the load cup, and
wherein the wafer station is vertically moveable between a first location where the wafer station is spaced from a wafer and a second location where the wafer is received by the wafer station, and wherein a notch in the wafer station is sized to receive a portion of the blade configured to support the wafer as the wafer station moves between the first location and the second location.

2. The wafer processing device of claim 1, wherein the blade located in the load cup is configured to remain stationary as the wafer station moves in a vertical direction to remove the wafer from the blade located in the load cup and to place the wafer on the blade located in the load cup.

3. The wafer processing device of claim 1, further comprising a nebulizer located in the load cup, the nebulizer including one or more nozzles configured to spray at least one fluid.

4. The wafer processing device of claim 3, wherein the nebulizer includes two or more sets of nozzles, wherein each set of nozzles is coupled to a different fluid source.

5. The wafer processing device of claim 3, wherein the nebulizer is in a fixed location within the load cup.

6. The wafer processing device of claim 3, wherein the nebulizer remains in a fixed location within the load cup during movement of the wafer station.

7. The wafer processing device of claim 1, wherein the wafer exchanger includes three or more blades movable between at least the load cup, the robot access location, and a rinse station.

8. The wafer processing device of claim 7, wherein the rinse station includes a nebulizer configured to rinse a wafer located therein.

9. The wafer processing device of claim 1, further comprising:
a first wafer exchanger including three blades;
a second wafer exchanger including three blades;
a first load cup accessible by the three blades of the first wafer exchanger; and
a second load cup accessible by the three blades of the second wafer exchanger.

10. The wafer processing device of claim 9, further comprising:
a first rinse station accessible by the three blades of the first wafer exchanger; and
a second rinse station accessible by the three blades of the second wafer exchanger.

11. The wafer processing device of claim 1, further comprising at least one polishing station, wherein wafers are transportable between the load cup and the at least one polishing station.

12. The wafer processing device of claim 1, comprising a nebulizer positioned in the load cup and configured to remain in a fixed location within the load cup during movement of the wafer station.

13. The wafer processing device of claim 12, wherein the nebulizer includes one or more upward-oriented nozzles.

14. The wafer processing device of claim 12, wherein the nebulizer includes two or more sets of nozzles, wherein each set of nozzles is coupled to a different fluid source.

* * * * *